United States Patent [19]
Sasama

[11] Patent Number: 5,465,228
[45] Date of Patent: Nov. 7, 1995

[54] ASSOCIATIVE MEMORY

[75] Inventor: Hiroshi Sasama, Tokyo, Japan

[73] Assignee: Kawasaki Steel Corporation, Kobe, Japan

[21] Appl. No.: 315,861

[22] Filed: Sep. 30, 1994

[30] Foreign Application Priority Data

Oct. 4, 1993 [JP] Japan .................... 5-248120

[51] Int. Cl.⁶ .................................. G11C 15/00
[52] U.S. Cl. ...................... 365/49; 365/189.01
[58] Field of Search ............... 365/49, 189.01; 395/425, 400

[56] References Cited

U.S. PATENT DOCUMENTS 4,296,475  10/1981  Nederlof et al. .
4,853,892   8/1989  Hori .
4,890,260  12/1989  Chuang et al. .
5,255,384  10/1993  Sachs et al. ................ 395/425
5,317,756   5/1994  Komatsu et al. ............ 395/800

FOREIGN PATENT DOCUMENTS 0230296   7/1987  European Pat. Off. .
0341899  11/1989  European Pat. Off. .
61-31558   7/1986  Japan .
4-216424   8/1992  Japan .
8807721  10/1988  WIPO .

Primary Examiner—Viet Q. Nguyen
Attorney, Agent, or Firm—Oliff & Berridge

[57] ABSTRACT

An associative memory is capable of performing at high speed a registration of unregistered data. Retrieval data is stored at the same time when a retrieval is carried out.

5 Claims, 11 Drawing Sheets

FIG. 3

| ATTRIBUTE / GROUP NO. | I | II | III | IV |
|---|---|---|---|---|
| 1 | A | B | C | D |
| 2 | C | F | G | H |
| 3 | J | K | L | M |
| 4 | C | A | B | D |
| ---- | ---- | ---- | ---- | ---- |
| n−1 | V | W | X | Z |
| n | | | | |
| n+1 | | | | | n ⇒ EMPTY (HIGHEST PRIORITY)
n+1 ⇒ EMPTY (A)

(B)

(C)

ASSOCIATIVE MEMORY

BACKGROUND OF THE INVENTION

1. Field of the Invention

The present invention relates to a content addressable memory or an associative memory comprising a number of word memories each for storing data, and having such a function that match or mismatch between data stored in word memories and retrieval data inputted to the word memories are retrieved.

2. Description of the Related Art

Recently, there has been proposed an associative memory provided with the retrieval function as mentioned above. First, there will be described arrangements and functions of the associative memory, and then examples of the field of application of the associative memory.

FIG. 9 is a circuit block diagram of the conventional associative memory by way of example.

Referring to FIG. 9, an associative memory 10 is provided with a number of word memories 11a, 11b, . . . , 11n each consisting of a 5-bit of serial memory cell by way of example. Further, the associative memory 10 comprises a retrieval register 12 which is arranged to receive and latch a word of retrieval data. A bit pattern of the retrieval data latched in the retrieval register 12 in its entirety or in a part specified is compared with a bit pattern of the portion corresponding to the bit pattern of the latched retrieval data with respect to data stored in each of the word memories 11a, 11b, . . . , 11n. As a result of the comparison, if there are found any of the word memories 11a, 11b, . . . , 11n of which the bit pattern matches with that of the retrieval data, a match signal given by a logic "1" will appear on the associated ones of match lines 14a, 14b, . . . , 14n which are provided in conjunction with the word memories 11a, 11b, . . . , 11n, respectively. On the other hand, a mismatch signal given by a logic "0" will appear on the remaining ones of the match lines 14a, 14b, . . . , 14n.

Assuming that the signals "0", "1", "0", "0", "1" . . . , "0" appear on the flag lines 14a, 14b, . . . , 14n, respectively, these signals are applied to a priority encoder 15. The priority encoder 15 is so arranged to output an address signal AD corresponding to the match line given with a highest priority among the match lines (here, two match lines 14b and 14e) on which the match signal given by a logic "1" appears. Supposing that the priority is higher as alphabet of a suffix of the reference character becomes younger, in this case, the match line 14b is selected as the highest priority match line. Thus, the priority encoder 15 outputs an address signal AD corresponding to the highest priority match line 14b, which address signal AD is applied to an address decoder 16, as occasion demands. The address decoder 16 decodes the received address signal AD and outputs an access signal (here a signal given by a logic "1") to the associated one (here a word line 17b) of word lines 17a, 17b, . . . , 17n which are provided in conjunction with the word memories 11a, 11b, . . . , 11n, respectively. Thus, data stored in the word memory 11b associated with the word line 17b on which the access signal appears is read out to an output data register 18.

As described above, according to the associative memory 10, the contents or data stored in a number of word memories 11a, 11b, . . . , 11n are retrieved using the retrieval data, so that an address of the word memory involved in the data match is generated, and thus it is possible to read out the whole data stored in the word memory.

FIG. 10 is a detailed circuit diagram of one of the word memories in the associative memory.

A word memory 11 comprises five memory cells 11-1, 11-2, . . . , and 11-n each having the same structure. The memory cells 11-1, 11-2, . . . , and 11-n are provided with first inverters 20-1, 20-2, . . . , and 20-n and second inverters 21-1, 21-2, . . . , and 21-n, in pairs such that their outputs are connected to their inputs, respectively. Providing pairs of inverters 20-1 and 21-1; 20-2 and 21-2; . . . ; and 20-n and 21-n permits the memory cells 11-1, 11-2, . . . , and 11-n to store one bit information expressed by logic "1" or logic "0", respectively.

In the memory cells 11-1, 11-2, . . . , and 11-n, the outputs of the first inverters 20-1, 20-2, . . . , and 20-n are connected through N channel transistors 22-1, 22-2, . . . , and 22-n to bit lines 23-1, 23-2, . . . , and 23-n, respectively. Gate electrodes of the transistors 22-1, 22-2, . . . , and 22-n are connected to a word line 24. The outputs of the second inverters 21-1, 21-2, . . . , and 21-n are connected through N channel transistors 25-1, 25-2, . . . , and 25-n to bit bar lines 26-1, 26-2, . . . , and 26-n, respectively. Gate electrodes of the transistors 25-1, 25-2, . . . , and 25-n are also connected to the word line 24. Further, in the memory cells 11-1, 11-2, . . . , and 11-n, there are provided pairs of N channel transistors 27-1 and 28-1; 27-2 and 28-2; . . . ; and 27-n and 28-n, respectively, which are connected in series between the bit lines 23-1, 23-2, . . . , and 23-n and the bit bar lines 26-1, 26-2, . . . , and 26-n, respectively. Gate electrodes of transistors 27-1, 27-2 . . . , and 27-n, as ones of these pairs of transistors 27-1 and 28-1; 27-2 and 28-2; . . . ; and 27-n and 28-n, are connected to the outputs of the first inverters 20-1, 20-2, . . . , and 20-n, respectively; and gate electrodes of other transistors 28-1, 28-2, . . . , and 28-n are connected to the outputs of the second inverters 21-1, 21-2, . . . , and 21-n, respectively.

On the match line 14, there are provided transistors 36-1, 36-2, . . . , and 36-n, which are associated with the word memories 11-1, 11-2, . . . , and 11-n, respectively, and are connected in series with each other. Gate electrodes of the transistors 36-1, 36-2, . . . , and 36-n are connected to points between pairs of transistors 27-1 and 28-1; 27-2 and 28-2; . . . ; and 27-n and 28-n, respectively.

Further, there is provided an additional transistor 36-0 connected in series with the match line 14 which is grounded through the transistor 36-0. A gate electrode of the transistor 36-0 is connected to the control line 30.

Furthermore, there is provided a sensing inverter 31 which is connected with the other end (right hand in FIG. 10) of the match line 14. The match line 14 extends also to the output side of the inverter 31 and is connected therethrough to the priority encoder 15 (refer to FIG. 9).

Between an input of the inverter 31 and the power supply $V_{DD}$, there are provided two P-type of transistors 32 and 33. A gate electrode of the P-type of transistor 32 is connected to the control line 30. A gate electrode of the P-type of transistor 33 is connected to an output of the inverter 31.

In the associative memory having the word memories as mentioned above in structure and its peripheral circuits, a match retrieval is conducted in a manner as set forth below.

Assuming that the memory cell 11-1 stores information of a logic "1", the output side of the first inverter 20-1 takes a state of a logic "1", and the output side of the second inverter 21-1 takes a state of a logic "0".

It is assumed that a retrieval for a logic "1" is performed for the above-mentioned memory cell 11-1. That is, the bit line 23-1 is enabled with a logic "1", and the bit bar line 26-1 is enabled with a logic "0". While the word line 24 is kept in a state of a logic "0". Since a logic level "1" of voltage is applied to the gate electrode of the transistor 27-1, and a logic level "1" of signal on the bit line 23-1 is applied to the gate electrode of the transistor 36-1, the transistor 36-1 turns on. That is, when the bit information stored in the memory cell 11-1 and the bit information in the retrieval data entered through the bit line 23-1 and the bit bar line 26-1 are equivalent to each other, the associated transistor 36-1 turns on.

Assuming that the memory cell 11-2 stores information of a logic "0", the output side of the first inverter 20-2 takes a state of a logic "0", and the output side of the second inverter 21-2 takes a state of a logic "1".

It is assumed that a retrieval for a logic "1" is also performed for the above-mentioned memory cell 11-2. That is, the bit line 23-2 is enabled with a logic "1", and the bit bar line 26-2 is enabled with a logic "0". In this case, a logic level "0" of signal on the bit bar line 26-2 is applied through the transistor 28-2 to the gate electrode of the transistor 36-2, so that the transistor 36-2 is kept turning off. Thus, in case of the mismatch, the electric charge, which has been precharged on the match line 14, is not discharged.

With respect to the masked bit, as shown concerning the memory cell 11-n, both the bit line 23-n and the bit bar line 26-n are enabled with the logic "1". In this case, either the transistor 27-n or the transistor 28-n turns on in accordance with the fact that the memory cell 11-5 has stored logic "0" of information or logic "1" of information, so that the transistor 36-n turns on in any way.

To conduct a retrieval, first, the control line 30 is enabled with "0", so that a transistor 32 turns on whereby a match line 14 at the input side of the inverter 31 is precharged. Thereafter, the control line 30 is enabled with "1", so that the transistor 32 turns off to stop the precharge and the transistor 36-0 turns on.

In this case, when data stored in the memory cells 11-1, 11-2, . . . , and 11-n, which memory cells constitute the word memory 11, match with the entered retrieval information throughout the memory cells (as mentioned above, the masked bit is regarded as a "match"), all of the transistors 36-1, 36-2, . . . , and 36-n turn on, so that the electric charge, which has been precharged on the match line 14, is discharged. Thus, the inverter 31 outputs a logic "1" of signal.

Incidentally, it is noted that FIG. 10 merely shows by way of example the memory structure of the associative memory, and there are proposed various types of structure (See, for example, Japanese Patent Application No. 216424/1993).

Next, there will be described an example of application of the associative memory to a LAN (Local Area Network) hereinafter.

FIGS. 11(A)–11(C) are each a view showing an example of the LAN.

As shown in FIG. 11(A), it is assumed that coupled to two communication lines LAN 1 and LAN 2 are a plurality of terminals A–G, and T–Z, respectively to constitute two communication networks. Further, it is assumed that traffic volume of each of the communication lines LAN 1 and LAN 2, that is, quantity of data transmitted via the communication line, or a degree of congestion of the communication line, is given with "10".

When there occurs a necessity for connecting these two communication lines to each other, if they are simply connected to each other, as shown in FIG. 11(B), then the traffic volume of the communication lines LAN 1 and LAN 2 becomes 20. This involves such a result that the communication lines are dramatically congested, so that the connection among the terminals becomes more difficult, thereby increasing waiting time and idle time.

Hence, usually, as shown in FIG. 11(C), connected between the communication lines LAN 1 and LAN 2 is a bridge for performing filtering as to whether or not data originated from one of the communication lines LAN 1 and LAN 2 is transmitted to the other. When the bridge is connected, assuming that traffic volume of data passing through the bridge, that is, traffic volume as to transfer of data bridging two communication lines LAN 1 and LAN 2, is "1", adding traffic volume "10" of the interior of each of the communication lines LAN 1 and LAN 2, traffic volume of each of the communication lines LAN 1 and LAN 2 becomes "11". Thus, traffic volume is extremely decreased in comparison with the case, as shown in FIG. 11(B), in which two communication lines LAN 1 and LAN 2 are simply connected to each other. Here, while there has been described the connection between two communication lines LAN 1 and LAN 2, connection of a number of communication lines to the bridge may enhance the difference in the traffic.

FIG. 12 is an illustration useful for understanding the function of the bridge.

The bridge includes a memory. First, starting with a null state, for example, when data is transmitted from the terminal A of the communication line LAN 1, upon receipt of the data from the communication line LAN 1 end, the bridge learns that the terminal A is connected to the communication line LAN 1. This learning is conceptually implemented in such a manner that the memory inside of the bridge is provided with table 1 and table 2, which are associated with the communication lines LAN 1 and LAN 2, respectively, and the terminal A is written into the table 1 associated with the communication line LAN 1. At the time point of the learning of the terminal A, it is not determined whether or not the receiving destination of the data transmitted from the terminal A resides in the communication network involved in the LAN 1 end, and thus at this time point the data is allowed to pass through unconditionally the bridge.

Repeat of the above-mentioned learning makes it possible to build table 1 and table 2, as shown in FIG. 12, in the bridge. After these tables have been built, for example, as shown in the figure, data which is involved in terminal B (the LAN 1 end) as a transmitting source and terminal X (LAN 2end) as a receiving destination, is allowed to pass through the bridge, upon recognition by the bridge of the fact that the terminals B and X are located at opposite sides over the bridge each other. On the other hand, in a case where the transmitting source and the receiving destination are denoted by terminals A and E both belonging to the LAN 1 end, data is inhibited from passing through the bridge, upon recognition by the bridge of the fact that the terminals A and E reside in the communication network which is located at the same side looking from the bridge. This scheme contributes to reduction of traffic volume.

Adopting an associative memory as the memory used in the bridge as mentioned above may contribute to a high speed processing. For example, the associative memory is used to store information concerning the respective terminals A–G and T–Z, and further information as to whether each of those terminals belongs to table 1 (being connected to the LAN 1 end) or table 2 (being connected to the LAN 2 end). To determine whether or not data is allowed to pass through the bridge, for example, in a case where the receiving destination is given with terminal X, the retrieval is performed using "X" as retrieval data, and it is recognized that "X" is a terminal belonging to table 2 (LAN 2). In this manner, it may be determined whether or not data is allowed to pass through the bridge.

On the contrary, the bridge is equipped with the conventional RAM or the like, there are needs to read out one by one data stored and retrieve the data through sequential comparison to identify as to whether or not the read data is involved in the terminal X. Thus, in this case, a lot of time will be required for determination as to allowance of passage of data through the bridge or inhibition of the data.

As described above, the associative memory may be preferably used in, for example, a LAN network and the like. Whereas, for example, when data is transmitted from the terminal A, it is confirmed whether the terminal A is already registered in the memory of the bridge, and if not it is necessary to register the terminal A. In this manner, hitherto, there are needed two steps, one of which is involved in the confirmation of registration, and another the implementation of registration in case of not registered. This hinders higher speed operation of the bridge.

SUMMARY OF THE INVENTION

In view of the foregoing, it is therefore an object of the present invention to provide an associative memory capable of performing at high speed a registration of unregistered data.

The first associative memory according to the present invention, which attains the above-mentioned object, basically comprises at least one word memory for storing data, and at least one match detection circuit associated with said word memory for detecting a match or mismatch between a whole or a predetermined partial bit pattern of an entered retrieval data and a whole or a part of bit pattern corresponding to said bit pattern of the retrieval data among data stored in said word memory, characterized by:

a data additional writing circuit for providing such a control that when none of said match detection circuits outputs a match signal indicative of detection of a match, the retrieval data is stored in one of the word memories, which do not store effective data as a retrieval object and thus reside in an empty state permitting an overwriting, among said word memories.

In the above-mentioned first associative memory, said data additional writing circuit may comprise:

(1) at least one flag register associated with said word memory for storing a flag indicative of whether the associated word memory is one residing in a storage state such that said effective data is stored therein or another one residing in said empty state;

(2) a retrieval data writing circuit for selecting one word memory from among the word memories residing in said empty state to write said retrieval data in the selected word memory; and (3) a flag alteration circuit for causing said flag register associated with said one word memory to store a flag indicative of said storage state, when none of said match detection circuits outputs the match signal.

Further, the second associative memory according to the present invention, which attains the above-mentioned object, basically comprises a plurality of word memory groups each comprising a plurality of word memories for storing a plurality of data constituting a single data group consisting of a plurality of storage data, wherein whenever retrieval data is entered, there is conducted a match retrieval between a whole or a predetermined partial bit pattern of an entered retrieval data and a whole or a part of bit pattern corresponding to said bit pattern of the retrieval data among data stored in said word memory, and in a predetermined number of times of match retrieval, including one time or a plurality of continuous number of times, the presence of the data group associated with the retrieval data entered said predetermined number of times is detected through detection of a match between a whole or a respective predetermined partial bit pattern of the entered retrieval data and a whole or a part of bit pattern corresponding to said bit pattern of the retrieval data among data stored in a same said word memory group throughout said predetermined number of times of match retrieval, characterized by:

a data writing circuit for writing the entered data, every retrieval during said predetermined number of times of match retrieval, in any one of the word memories within one word memory group selected from among the word memory groups which do not store effective data group as retrieval object and thus reside in an empty state permitting an overwriting.

In the above-mentioned second associative memory, it is preferable that said second associative memory further comprises:

(4) a plurality of flag registers each corresponding to an associated one of said plurality of word memory groups, for storing a flag indicative of whether the associated word memory group is one residing in a storage state such that said effective data group is stored therein or another one residing in said empty state; and (5) a flag alteration circuit for causing said flag register associated with said one word memory group to store a flag indicative of said storage state, when there is not detected data group corresponding to the retrieval data entered the predetermined number of times, as a result of said predetermined number of times of match retrieval.

Further, as another aspect of the present invention, in the above-mentioned second associative memory, it is preferable that said second associative memory further comprises:

(6) a plurality of flag registers each corresponding to an associated one of said plurality of word memory groups, for storing a flag indicative of whether the associated word memory group is one residing in a storage state such that said effective data group is stored therein or another one residing in said empty state; and (7) a flag alteration circuit responsive to a predetermined instruction signal entered from an exterior for causing said flag register associated with said one word memory group to store a flag indicative of said storage state.

According to the first associative memory of the present invention, upon receipt of information as to the fact that a match detection is not implemented through a retrieval, the retrieval data is stored at that time. Thus, there is no need to provide two steps, as in the related art, of a retrieval operation and a writing operation of data when a match detection is not implemented through a retrieval. Thus, it is possible to contribute to provide a higher speed of processing.

There is disclosed, in Japanese Patent Publication No. 31558/1986, a relevant art. Thus, a difference between the technology proposed in the relevant art and the present invention will be described hereinafter.

A number of word memories, which constitutes an associative memory, do not always data as an object of the retrieval in its entirety. It happens that a part of those word memories are each in an empty state in which effective data is not stored therein, or new effective data is written into the empty word memory. In this case, since it is troublesome to manage at the outside what word memory is in an empty state, a flag indicative of whether effective data is stored in the associated word memory, or the word memory concerned is in an empty state is stored in the associated word memory. When the effective data is written, the associative memory itself finds out the empty word memory to write the effective data therein.

The proposed technology in the relevant art is intended to avoid a necessity for management of word memories in the empty state at outside. However, the proposed technology needs two steps of a retrieval operation and a registration operation for data when unregistered.

On the contrary, according to the second associative memory of the present invention, there is provided a word memory group for storing data group, and a retrieval operation through entering retrieval data is performed a predetermined number of times so as to detect the presence of the associated data group.

Specifically, in such an associative memory, assuming that data group consisting of, for example, 100 pieces of data, is stored and a retrieval operation through entering retrieval data is performed repeatedly 100 times so as to detect the presence of a desired data group. According to the use of such a type of associative memory proposed hitherto that the presence of the data group is detected, if a desired data group is not found as a result of 100 times of retrieval, then a new effective data group will be registered through writing the retrieval data 100 times.

On the contrary, according to the second associative memory of the present invention, retrieval data is written into the word memory group residing in the empty state every retrieval. Thus, even if a desired data group is not found as a result of 100 times of retrieval, the retrieval data has been written every retrieval. Thus, this merely needs only a determination as to whether or not the word memory group, to which the new retrieval data have been written, is used for the subsequent retrieval and thereafter retrieval, whereby this permits the procedure of data writing to be remarkably reduced and contributes to the higher speed of processing.

The determination as to whether or not the word memory group, to which the new retrieval data have been written, is used for the subsequent retrieval and thereafter retrieval, may be implemented in such a manner that for example, the flag registers referenced to in the above items (4) or (6) are used to rewrite the flag stored in the flag register concerned.

Regarding the rewriting of the flag, it is preferable to provide such an arrangement in which the flag alteration circuit referenced to in the above item (5) is used, upon receipt of information indicating the fact that a desired data group is not detected through a predetermined number of times of retrieval, to automatically conduct the rewriting. Whereas, as another aspect of the present invention, it is also acceptable to provide such an arrangement in which the flag alteration circuit referenced to in the above item (7) is used to receive an instruction of rewriting from the exterior. In this case also, it is possible to contribute to the remarkable higher speed of processing.

BRIEF DESCRIPTION OF THE DRAWINGS

FIG. 3 is an illustration of group structure of data by way of example;

DESCRIPTION OF THE PREFERRED EMBODIMENTS

Hereinafter, there will be described embodiments of the present invention.

Figure 1:
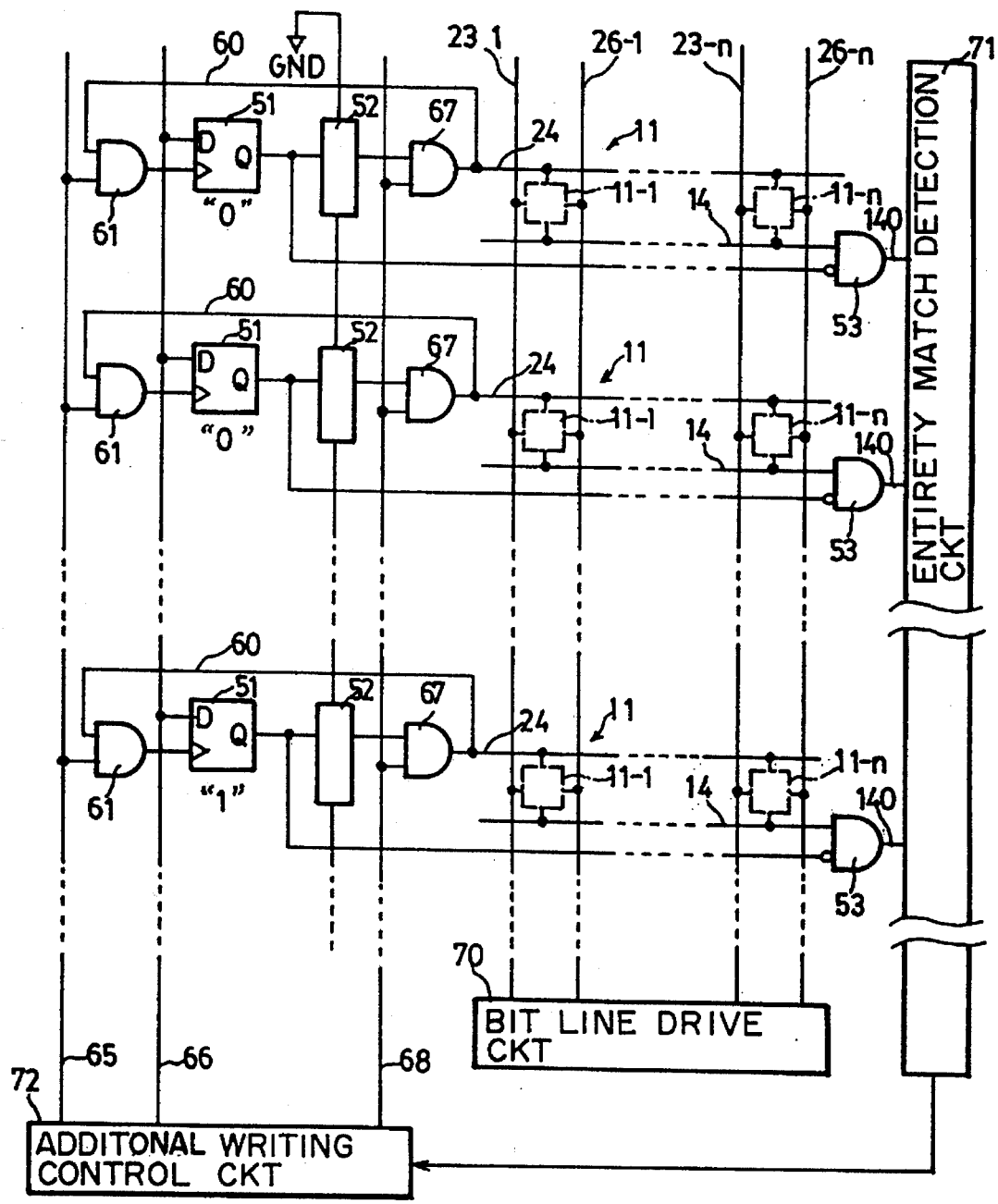
FIG. 1 is a circuit diagram of an aspect portion of the first associative memory according to an embodiment of the present invention.
Figure 10:
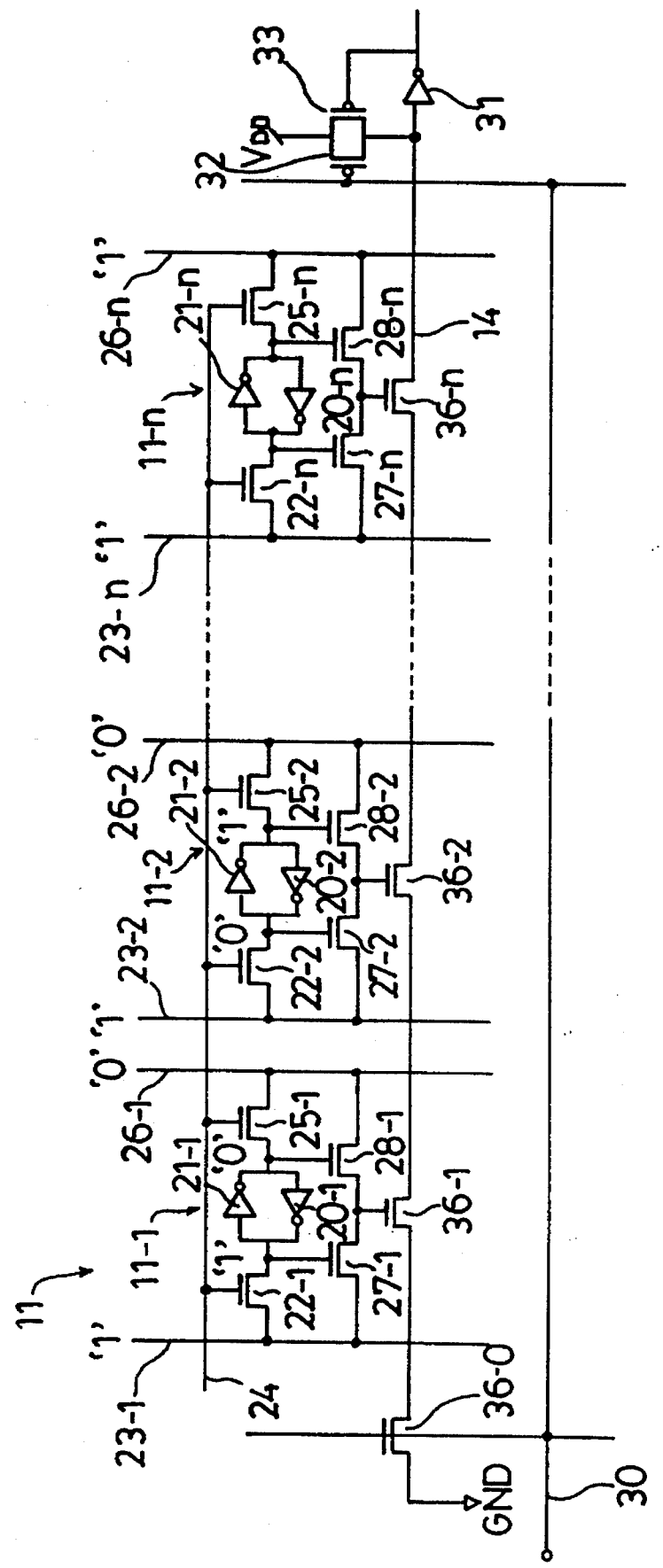
FIG. 10 is a detailed circuit diagram of one of the word memories in the associative memory.
Figure 11A:
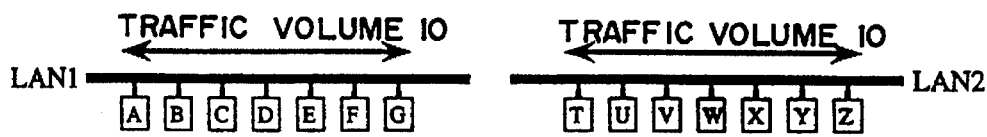
FIGS. 11(A)–11(C) are each an illustration of LAN's by way of example.
Figure 11B:
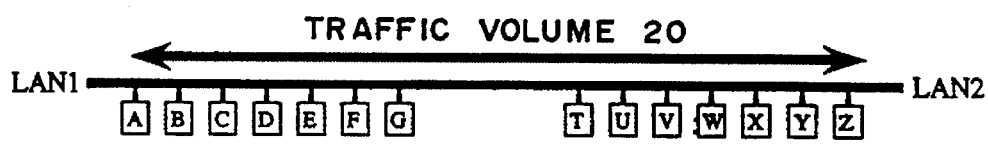
Figure 11C:
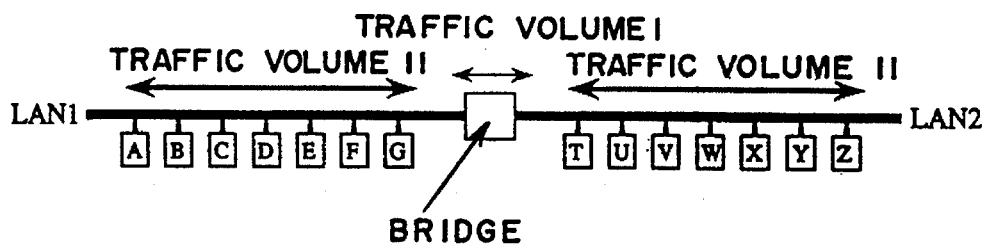
Figure 12:
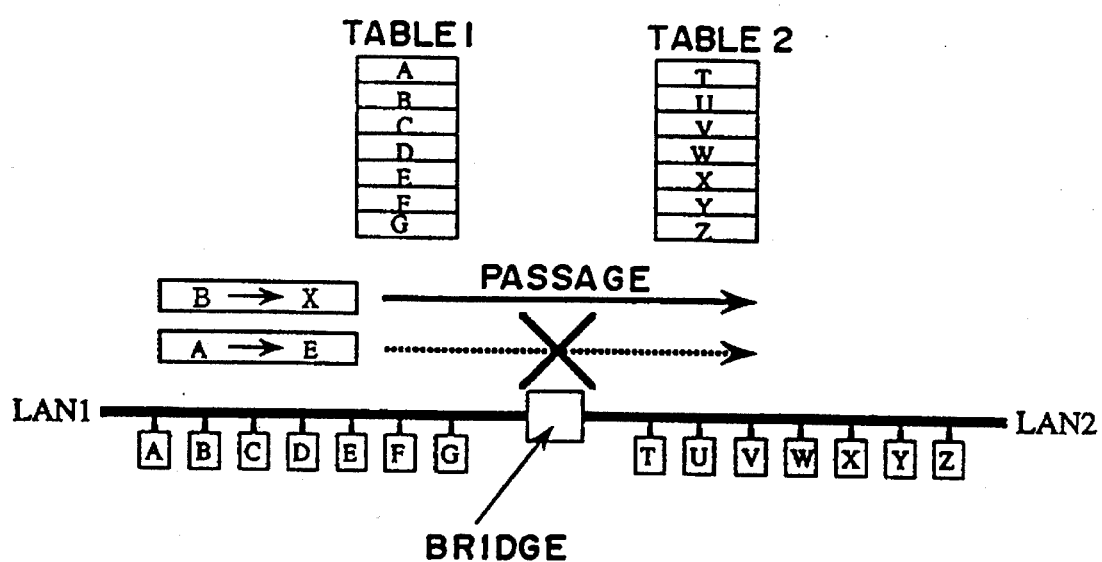
FIG. 12 is a view useful for understanding a function of a bridge.

FIG. 1 is a circuit diagram of an aspect portion of the first associative memory according to an embodiment of the present invention. In FIG. 1, the same parts are denoted by the same reference numbers as those of FIG. 10 involved in the related art.

In FIG. 1, arrangements of word memories 11 and match lines 14 are omitted. There are provided flag registers 51 each corresponding to the associated word memory 11. The flag register 51 stores a logical value "0" when the associated word memory 11 stores effective data which is the retrieval object, and stores a logical value "1" of empty flag when the associated word memory 11 stores ineffective data which is out of the retrieval object and thus allows overwrite (this is referred to as that the associated word memory 11 is "in an empty state"). Here, it is assumed that the flag registers 51 store, as shown in the figure, signals "0", "0", . . . , "1", respectively. A Q-output of the flag register 51 is applied to the associated plural-selection separating circuit 52. The plural-selection separating circuits 52 are connected in series, and are provided with the higher priority with upper one in the figure. In a case where the empty flag "1" is stored in a plurality of flag registers 51, the signal "1" is outputted from only the plural-selection separating circuit 52 associated with the flag register 51 having the highest priority among the plurality of flag registers 51 storing "1". Here, the flag register 51, which is placed at the lowest stage of the circuit diagram shown in FIG. 1, is provided with the highest priority. Thus, the signal "1" is outputted from the plural-selection separating circuit 52 placed at the lowest stage.

Figure 2B:
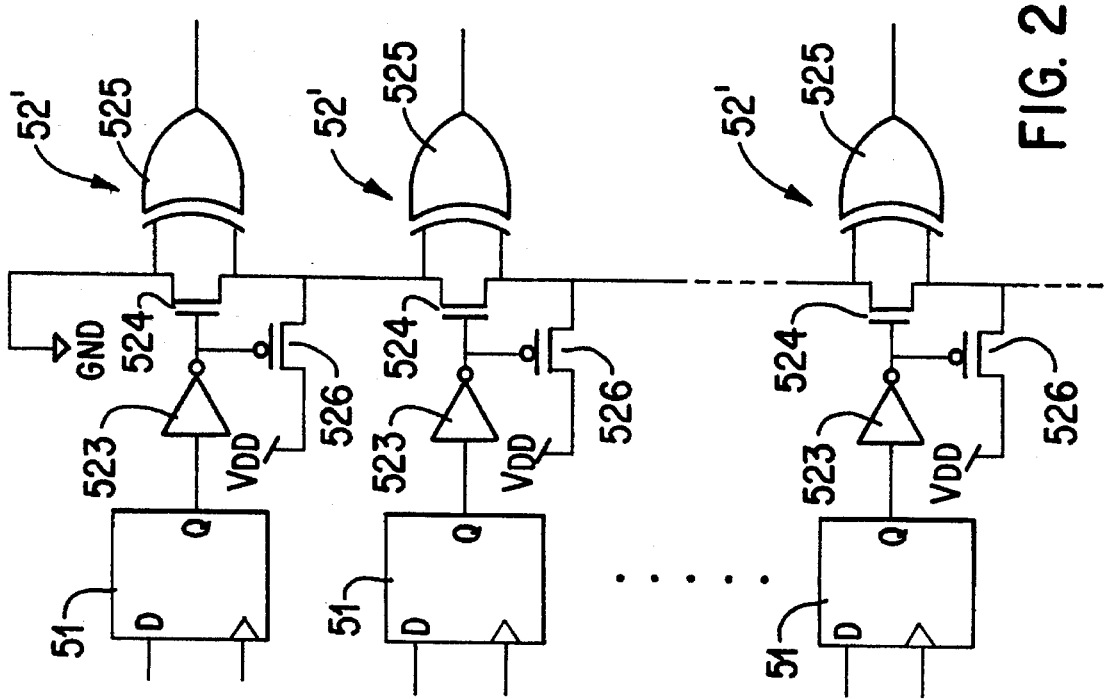
FIGS. 2(A) and 2(B) are each a circuit diagram of a plural-selection separating circuit by way of example.
Figure 2A:
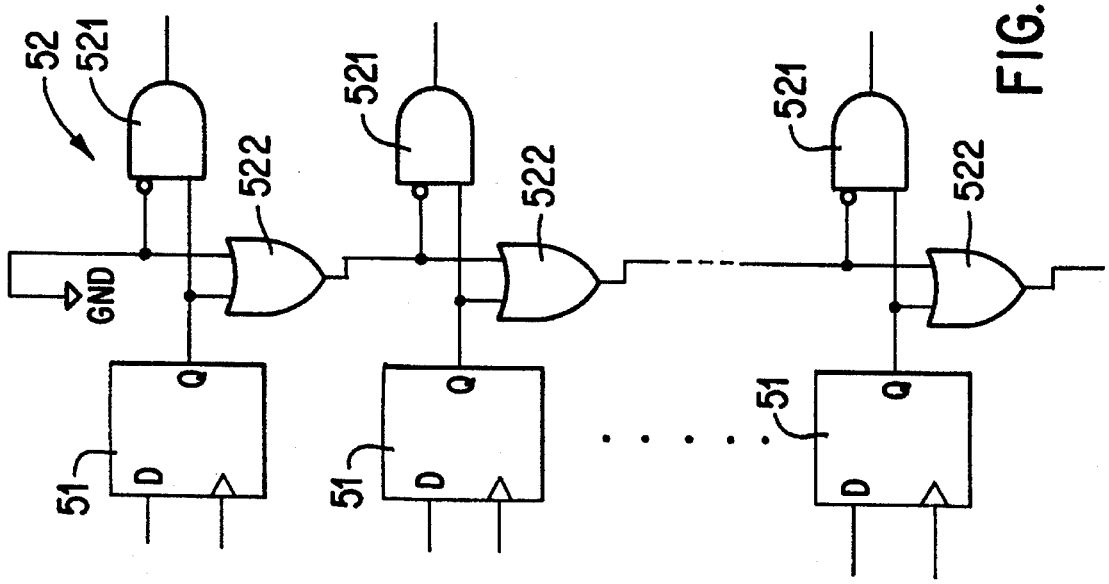

FIGS. 2(A) and 2(B) are each a circuit diagram of a plural-selection separating circuit 52 by way of example.

The plural-selection separating circuits 52 shown in FIG. 2(A) each comprise an AND gate 521 having two inputs one of which is inverted in input, and an OR gate 522, which are connected as shown in the figure. One of the inputs of the OR gate 522, illustrated in the top of the figure, constituting the plural-selection separating circuit 52, is earthed (ground GND).

In the plural-selection separating circuits 52, the priority is higher with upper one in the figure. In a case where the empty flag "1" is stored in a plurality of flag registers 51, the signal "1" is outputted from the AND gate 521 of the plural-selection separating circuit 52 associated with the flag register 51 having the highest priority among the plurality of flag registers 51.

The plural-selection separating circuits 52' shown in FIG. 2(B) each comprise, as shown in the figure, an inverter 523, an n-channel transistor 524, a p-channel transistor 526 and an exclusive OR gate 525. One end of the p-channel transistor 526, constituting each the plural-selection separating circuit 52', is connected to a power source $V_{DD}$. And one of the inputs of the exclusive OR gate 525, illustrated in the top of the figure, constituting the plural-selection separating circuit 52', is earthed (ground GND).

Also in the plural-selection separating circuits 52' shown in FIG. 2(B), similar to the plural-selection separating circuits 52 shown in FIG. 2(A), the priority is higher with upper one in the figure. In a case where the empty flag "1" is stored in a plurality of flag registers 51, the signal "1" is outputted from the exclusive OR gate 525 of the plural-selection separating circuit 52' associated with the flag register 51 having the highest priority among the plurality of flag registers 51.

Figure 9:
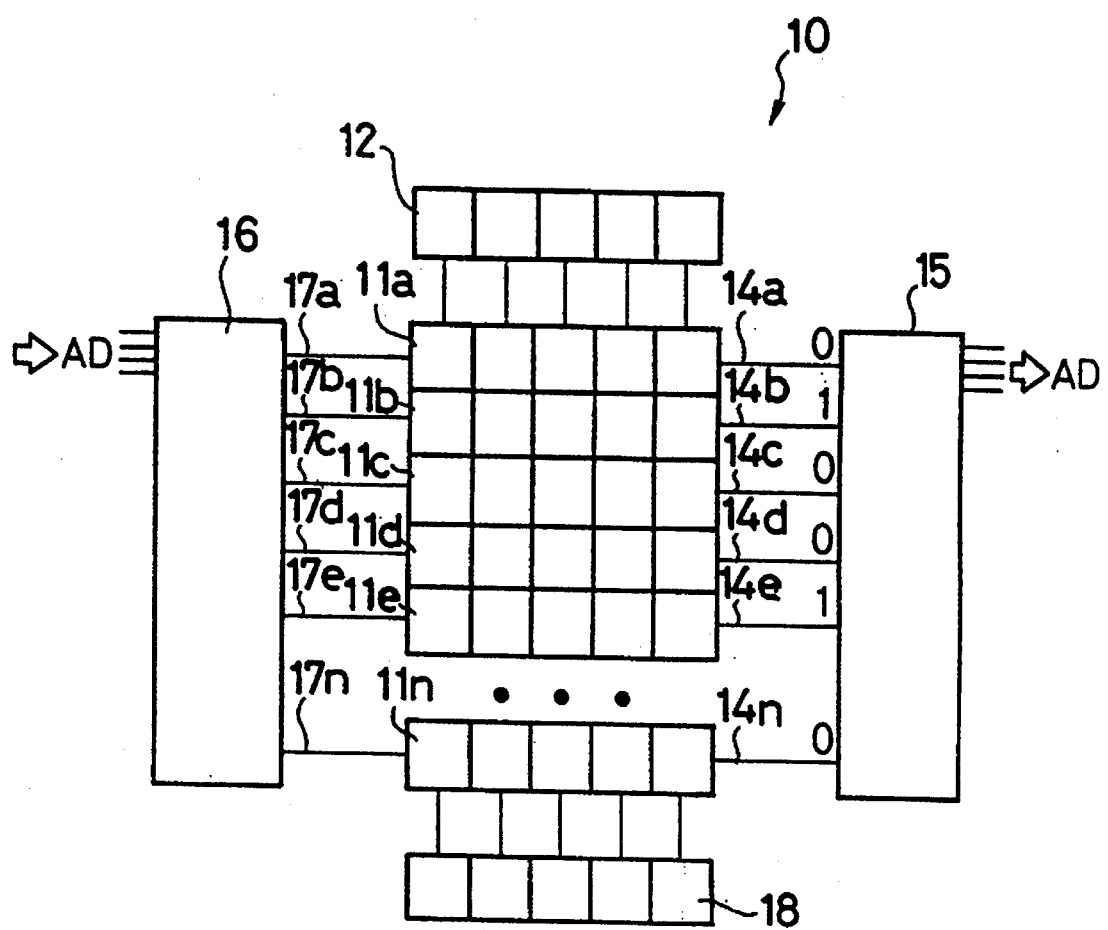
FIG. 9 is a circuit diagram of an associative memory according to the prior art by way of example.

Connecting an encoder to the last stage of the plural-selection separating circuit shown in FIG. 2(A) or FIG. 2(B) may constitute the priority encoder 15 shown in FIG. 9.

Thus, in a case where the flag register 51 shown in the lowest part in FIG. 1 is the highest priority of one among the plurality of flag registers 51 which store the empty flag "1", the signal "1" is outputted from the associated plural-selection separating circuit 52, and then supplied to the AND gate 67. The input of the AND gate 67 is also connected to a word line activating timing signal line 68.

Assuming that when a retrieval is conducted through supplying retrieval data from a bit line drive circuit 70 to bit line 23-1, ..., and 23-n, and bit bar line 26-1, ..., and 26-n, respectively, the retrieval data and the data stored in the word memory shown in the top portion in the figure match, a match line 14 in the top is given with a logical value "1". Hence, an output of the AND gate 53 becomes a logical value "1", since an output of the associated flag register 51 is of a logical value "0". Here, a signal line extending from the output of the AND gate 53 is also referred to as a match line 140. All the match lines 140 corresponding to the associated word memories 11, respectively, are extended to an entirety match detection circuit 71, and also extended, instead of the match line 14 referred to in the relevant art, to the priority encoder 15 (FIG. 9). In a case where the flag register 51 stores the empty flag "1", even if there occurs a match on the word memory 11 associated with the flag register 51 concerned, the logical value "1" of signal on the match line 14 is inhibited by the AND gate 53. Thus, the match line 140 is kept "0". In other words, the word memory 11 concerned does not contribute to the retrieval.

The entirety match detection circuit 71 is arranged to perform an OR operation for the signals received through the match lines 140 to detect whether a match occurs on any word memory 11 or a mismatch occurs throughout the word memories 11. A result is supplied to an additional writing control circuit 72. The additional writing control circuit 72 provides such a control that while a retrieval is carried out through supplying retrieval data to the bit line 23-1, ..., and 23-n, and the bit bar line 26-1, ..., and 26-n, the word line activating timing signal line 68 is enabled with a signal "1" regardless of whether or not a match occurs on any word memory 11. As a result, an output of an AND gate 67 associated with the plural-selection separating circuit 52 located at the lowest stage in the figure becomes "1", and then a logical level "1" of signal appears on the associated word line 24. Thus, the retrieval data is written into the word memory 11 located at the lowest stage in the figure. The timing of the writing of the retrieval data is the same as the retrieval, and thus it is independently of whether or not a match occurs through the retrieval.

Thereafter, as described above, in the entirety match detection circuit 71, it is detected whether a match occurs on any word memory 11 or a mismatch occurs throughout the word memories 11, and a result is passed to the additional writing control circuit 72. In the additional writing control circuit 72, when a match occurs on any word memory 11, there is nothing to do thereafter. Specifically, while the retrieval data is overwritten onto the word memory 11 located at lowest stage, the associated flag register 51 stores still the empty flag "1". Consequently, the word memory 11 concerned is kept placed in the empty state such that it does not contribute to the retrieval.

On the other hand, in a case where it is detected by the entirety match detection circuit 71 that a mismatch occurs throughout the word memories 11, the additional writing control circuit 72 operates as follows.

While a logical value "0" of signal is applied to an empty flag data line 66 connected to the flag register 51, a clock pulse "1" is applied to an empty flag clock signal line 65. Since the word line 24 of the word memory 11 located at the lowest stage in the figure is given with a logical value "1" of signal, and this signal is passed via the signal line 60 to the AND gate 61 located at the lowest stage, the clock pulse applied to the empty flag clock signal line 65 is entered through the AND gate 61 concerned to the flag register 51 located at the lowest stage in the figure. Thus, the word memory 11 associated with the flag register 51 located at the lowest stage stores a logical value "0" indicating that an effective data as the retrieval object has been stored therein.

As the flag register 51 located at the lowest stage stores a logical value "0", the plural-selection separating circuit 52 may detect the highest priority of one from among the flag registers 51 storing the empty flag, except for the flag register 51 concerned.

Next, while an embodiment of the second associative memory of the present invention will be described, there is not yet well known an associative memory (see Japanese Patent Application No. 248121/1993) wherein data groups are beforehand stored for retrieval, to which a technical idea of the second memory of the present invention is preferably applicable. Consequently, first, there will be described associative memory itself as a base, and then the embodiment of the second associative memory of the present invention will be described.

FIG. 3 is an illustration of data having a group structure by way of example.

In FIG. 3, there is shown a data structure constituting a set of data group consisting of four pieces of data to which attributes I, II, III and IV are allotted, respectively. In order to make clear the conception of the data groups and the attributes, rising examples, data groups for the respective group numbers 1, 2, 3, 4 . . . , each denote data belonging to individual person, attribute I the person's name; attribute II the person's birth day; attribute III the person's address, . . . , and so on.

In case of the retrieval using an associative memory storing data groups each consisting of a plurality of data to which attributes I, II, III and IV are allotted, respectively, if the case such that data of, for example, the group number 1 is retrieved, by way of example, is explained, there is considered an associative memory capable of performing a various schemes of retrieval in view of requirements such that it is desired not only to perform retrieval of data "A" and "B" in the named order and read out the remaining data "C" and "D" other than the matched data group, but also to perform for example, retrieval of data "A" and "D" and read out the remaining data "B" and "C", or it is desired that first, the retrieval of data "B" is conducted, and then the retrieval of data "A" is conducted.

Here, as a matter of convenience of the later explanation, it is assumed that the group numbers n and n+1 is placed in the empty state in which no effective data group is recorded.

Figure 4:
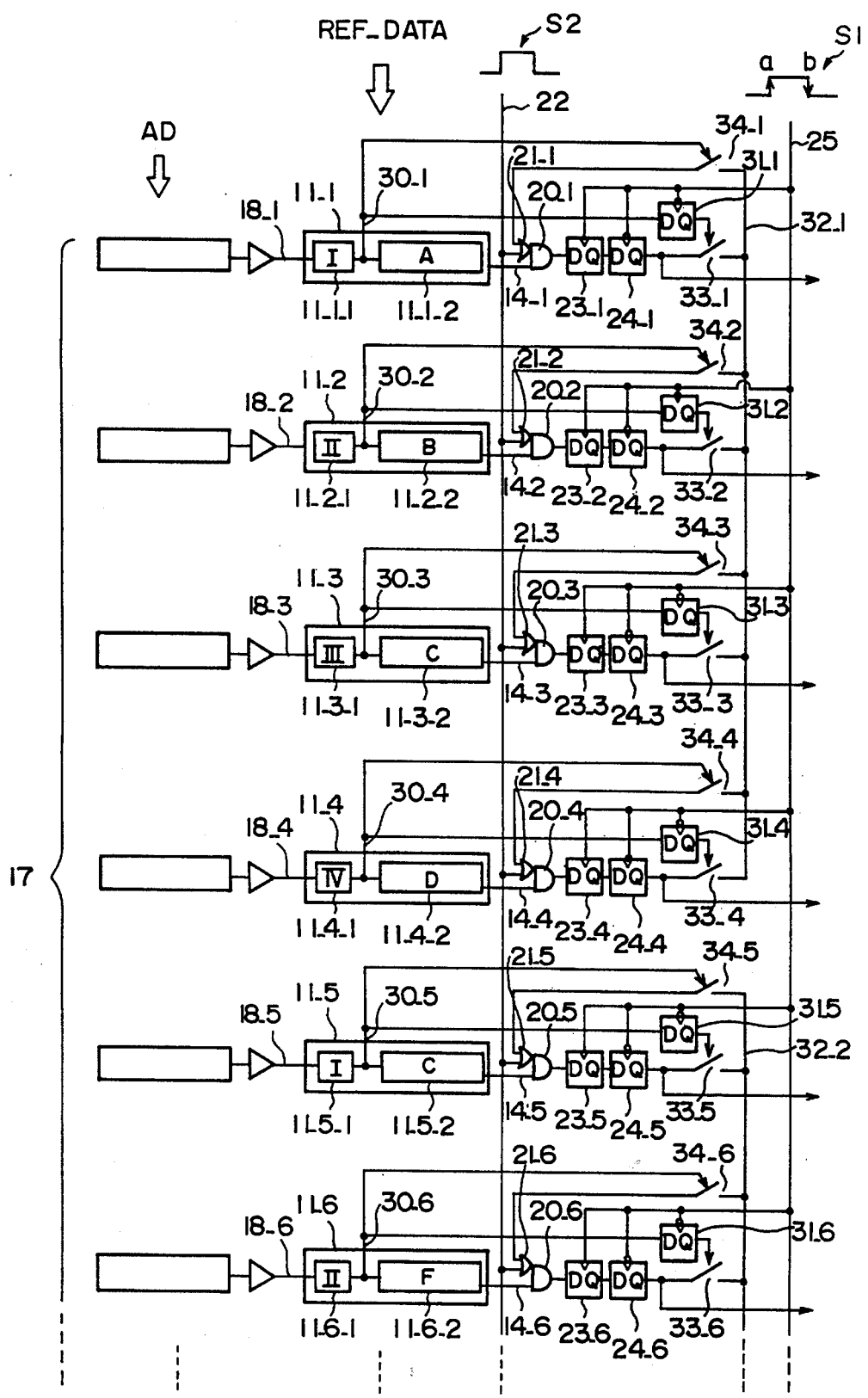
FIG. 4 is a block diagram of an example of the associative memory adapted to deal with group structure of data.

FIG. 4 is a block diagram of an example of the associative memory adapted to deal with group structure of data.

Match lines 14_1, 14_2, . . . , which are extended from the word memories 11_1, 11_2, . . . , respectively, are connected to ones of two input terminals of AND gates 20_1, 20_2, . . . , respectively. Connected to the other ones of the two input terminals of the AND gates 20_1, 20_2, . . . are output terminals of OR gates 21_1, 21_2, . . . , respectively. Ones of two input terminals of the OR gates 21_1, 21_2, . . . are connected to a first time retrieval control line 22.

Output terminals of the AND gates 20_1, 20_2, . . . are connected to data input terminals of first flag registers 23_1, 2_32, . . . , respectively. Output terminals of the first flag registers 23_1, 23_2, . . . are connected to input terminals of second flag registers 24_1, 24_2, . . . , respectively. Output terminals of the second flag registers 24_1, 24_2, . . . are connected to the priority encoder 15 shown in FIG. 9 (omitted in FIG. 4), and in addition through the first switch 33_1, 33_2, . . . , to data lines 32_1, 32_2, . . . , respectively, which data lines 32_1, 32_2, . . . , are provided for the associated word memory groups each for storing data group, respectively.

Applied to both the first flag registers 23_1, 23_2, . . . and the second flag registers 24_1, 24_2, . . . are a match result latch signal S1 which appears on a match result latch control line 25, so that input data entered from the respective data input terminals are latched. In the first flag registers 23_1, 23_2, . . . , there are latched the input data involved in the time point of a rising edge a of the match result latch signal S1. On the other hand, in the second flag registers 24_1, 24_2, . . . , there are latched the input data involved in the time point of a falling edge b of the match result latch signal S1.

Word memories 11_1, 11_2, . . . comprise attribute storage units 11_1_1, 11_2_1, . . . each for storing an attribute and data storage units 11_1_2, 11_2_2, . . . each for storing data, respectively. The word memories 11_1, 11_2, . . . each store storage data consisting of a pair of mutually associated attribute and data. As shown in FIG. 4, it is assumed that the word memories 11_1, 11_2, 11_3 and 11_4 store attribute I and data 'A', attribute II and data 'B', attribute III and data 'C' and attribute IV and data 'D', respectively, which belong to group No.1 shown in FIG. 3. Similarly, the word memories 11_5, 11_6, . . . store attribute I and data 'C', attribute II and data 'F', . . . , respectively, which belong to group No.2 shown in FIG. 3. To effect the retrieval, reference data REF_DATA, which consists of a pair of attribute and data, is applied.

The word memories 11_1, 11_2, . . . are provided with attribute match lines 30_1, 30_2, . . . , to which each signal representative of a match or mismatch concerning only the attribute is supplied, as well as the conventional match lines 14_1, 14_2, . . . , respectively, to which each a match signal is supplied when the storage data (both the attribute and the data) coincides with the applied reference data (both the attribute and the data). With respect to detection of a match of only the attribute and a match of both the attribute and the data, it is possible to implement such a function with the use of the conventional match detection circuit. Thus, the illustration of such a match detection circuit and the explanation will be omitted.

There are provided third flag registers 31_1, 31_2, . . . , which are associated with the word memories 11_1, 11_2, . . . , respectively. The attribute match lines 30_1, 30_2, . . . are extended to data input terminals of the associated third flag registers 31_1, 31_2, . . . , respectively. Further, in the associative memory according to the present embodiment, there are provided data lines 32_1, 32_2, . . . each on the associated word memory group comprising word memories each storing data belonging to the associated data group shown in FIG. 3, as mentioned above. Furthermore, there are provided first switches 33_1, 33_2, . . . between the data lines 32_1, 32_2, . . . and output terminals of the third flag registers 31_1, 31_2, . . . , respectively. The first switches 33_1, 33_2, . . . are each constituted of a transistor and the like. Also with respect to other switches described later, it is the same as this constitution. The first switches 33_1, 33_2, . . . turn on when the associated third flag registers 31_1, 31_2, . . . each latch a logic "1" of signal, respectively, and they turn off when latching a logic "0" of signal. The third flag registers 31_1, 31_2, . . . latch signals appearing on the associated attribute match lines 30_1, 30_2, . . . , respectively, in timing of the trailing edge b of the match result latch signal S1 which appears on the match result latch control line 25.

Furthermore, there are provided second switches 34_1, 34_2, . . . between the data lines 32_1, 32_2, . . . and input terminals of OR gates 21_1, 21_2, . . . , respectively. The second switches 34_1, 34_2, . . . are controlled in such a manner that they turn on when signals of the associated attribute match lines 30_1, 30_2, . . . each take a logic level "1" representative of a match, and they turn off when taking a logic "0" representative of a mismatch.

In the associative memory arranged as described above, a match retrieval is effected in such a manner as set forth below.

To retrieve solely individual retrieval data, a first time retrieval timing signal S2 is supplied to the first time retrieval control line 22, when the retrieval is performed through inputting the reference data REF-DATA. Assuming that attribute II and data "B" are inputted as the reference data REF-DATA, a logic "1" of match signal appears on the match line 14_2 associated with the word memory 11_2 in which attribute II and data "B" has been stored, and is supplied to the AND gate 20-2. Simultaneously, the first time retrieval timing signal S2 is supplied via the first time retrieval control line 22 through the OR gate 21_2 to the AND gate 20_2. As a result, the AND gate 20_2 produces a logic "1" of signal. On the other hand, since logic "0" of signals appear on the other match lines 14_1, 14_3, 14_4, ..., respectively, the associated AND gates 20-1, 20_3, 20_4, ... produce logic "0" of signals, respectively.

The logic "1" of signal outputted from the AND gate 20_2 is latched by the first flag register 23_2 in timing of the rising edge a of the match result latch signal S1 appearing on the match result latch control line 25, and then latched by the second flag register 24_2 in timing of the subsequent falling edge b of the match result latch signal S1.

On the other hand, logic "0" of signals are latched by the other first flag registers 23_1, 23_3, 23_4, ... in the same timing as the logic "1" of signal is latched by the first flag register 23_2, and logic "0" of signals are latched by the other second flag registers 24_1, 24_3, 24_4, ... in the same timing as the logic "1" of signal is latched by the second flag register 24_2.

In this manner, signals expressed by logic "0", "1", "0", ..., which are latched by the second flag registers 24_1, 24_2, 24_3, ..., respectively, are supplied to the priority encoder 15 as shown in FIG. 9 to generate an address signal AD of the word memory 11_2.

Next, there will be described a case of a plurality of number of times of continuous data retrieval. In this case, the first time of retrieval is the same as the operation of a single data retrieval as mentioned above. In the retrieval for the first time, however, there is additionally performed the following operation for preparation of the second time of data retrieval.

In the data retrieval for the first time, upon receipt of a match of the attribute, a logic "1" of signal appears on the attribute match line 30_2 associated with the word memory 11_2. As a result, a logic "1" of signal is latched also by the associated third flag register 31_2, so that the associated first switch 33_2 turns on, whereby a logic "1" of signal stored in the associated second flag register 24_2, which logic "1" is representative of a match of both the attribute and the data, is supplied to the data line 32_1. Simultaneously, the associated second switch 34_2 also turns on. However, this is useless operation for the first retrieval.

Next, let us consider a retrieval through inputting a reference data REF_DATA consisting of attribute IV and data "D". In this case, the first time retrieval control line 22 is kept at a logic level "0". In this state, upon receipt of a match of the attribute, a logic "1" of signal appears on the attribute match line 30_4 associated with the word memory 11_4. As a result, the associated second switch 34_2 turns on, so that the logic "1" of signal, appearing on the data line 32_1, of the associated second flag register 24_2 is applied through an OR gate 21_4 to an AND gate 20_4. Hence, when a match of both the attribute IV and the data "D" is detected in the word memory 11_4 and a logic "1" of match signal is supplied to a match line 14_4, a logic "1" of signal is latched, by the associated first and second flag registers 23_4 and 24_4 in compliance with the match result latch signal S1 which appears on the match result latch control line 25, in rising and falling edges of the latch signal S1, respectively. Whereas a logic "1" of signal supplied to the attribute match line 30_4 is latched in the trailing edge of the latch signal S1 by the associated third flag register 31_4, so that the associated first switch 33_4 turns on whereby the logic "1" of signal is supplied to the data line 32_1. In the second time of retrieval, a logic "0" of signal representative of a mismatch of attribute is supplied to the attribute match line 30_2 associated with the word memory 11_2, and thus the associated third flag register 31_2 stores a logic "0" of signal, whereby the first switch 33_2 associated with the word memory with the word memory 11_2 turns off in timing of trailing edge of the latch signal S1.

With respect to encoding of the bit address, a logic "1" of signal of the second flag register 24_4 associated with the word memory 11_4 is applied to the priority encoder 15 (see FIG. 9) so that the address of the word memory 11_4 is derived. Here, it is known beforehand that attribute IV has been stored in the word memory 11_4. Accordingly, when it is desired that data involved in, for example, the attribute III within the same group is read out, it may be sufficient that the address of the word memory 11_3 is determined through subtracting 1 from the derived address, and the determined address is applied to the address decoder 16 to read the content of the word memory 11_3.

In the second time of retrieval, if the retrieval is carried out with the use of the reference data consisting, for example, attribute IV and data "B", instead of the reference data consisting attribute IV and data "D", regarding the word memory 11_4, the associated second switch 34_4 turns on since a match of the attribute is attained, so that a logic"1" of signal appearing on the data line 32_1 is taken in. Whereas, since the data is different, a logic "0" of signal representative of a mismatch is supplied to the match line 14_4, so that the first and second flag registers 23_4 and 24_4 latch a logic "0" indicating that no match is detected. Further, regarding the word memory 11_2 involved in a match of data "B", it involves no match of the attribute and thus involving no match of both the attribute and the data.

In such a manner as mentioned above, according to the embodiment shown in FIG. 4, it is possible to implement a retrieval even in a case where data to be retrieved are stored in mutually distant word memories as far as those within the same group, or a case where the retrieval is effected independently of a sequence of data stored in the word memories.

According the embodiment as described above, the data line 32_1, 32_2, ..., are each fixed in length on the assumption that the number of data belonging to a single group is predetermined. However, providing such a fixed length of data line causes such a necessity that a maximum of the number of data belonging to a single group is estimated to provide a data line having a length corresponding to the maximum data number. This causes useless word memories when data groups each are constituted of data less than the maximum. Thus, it is preferable to adopt a variable length of data line to meet the number of data belonging to a single group.

Figure 5:
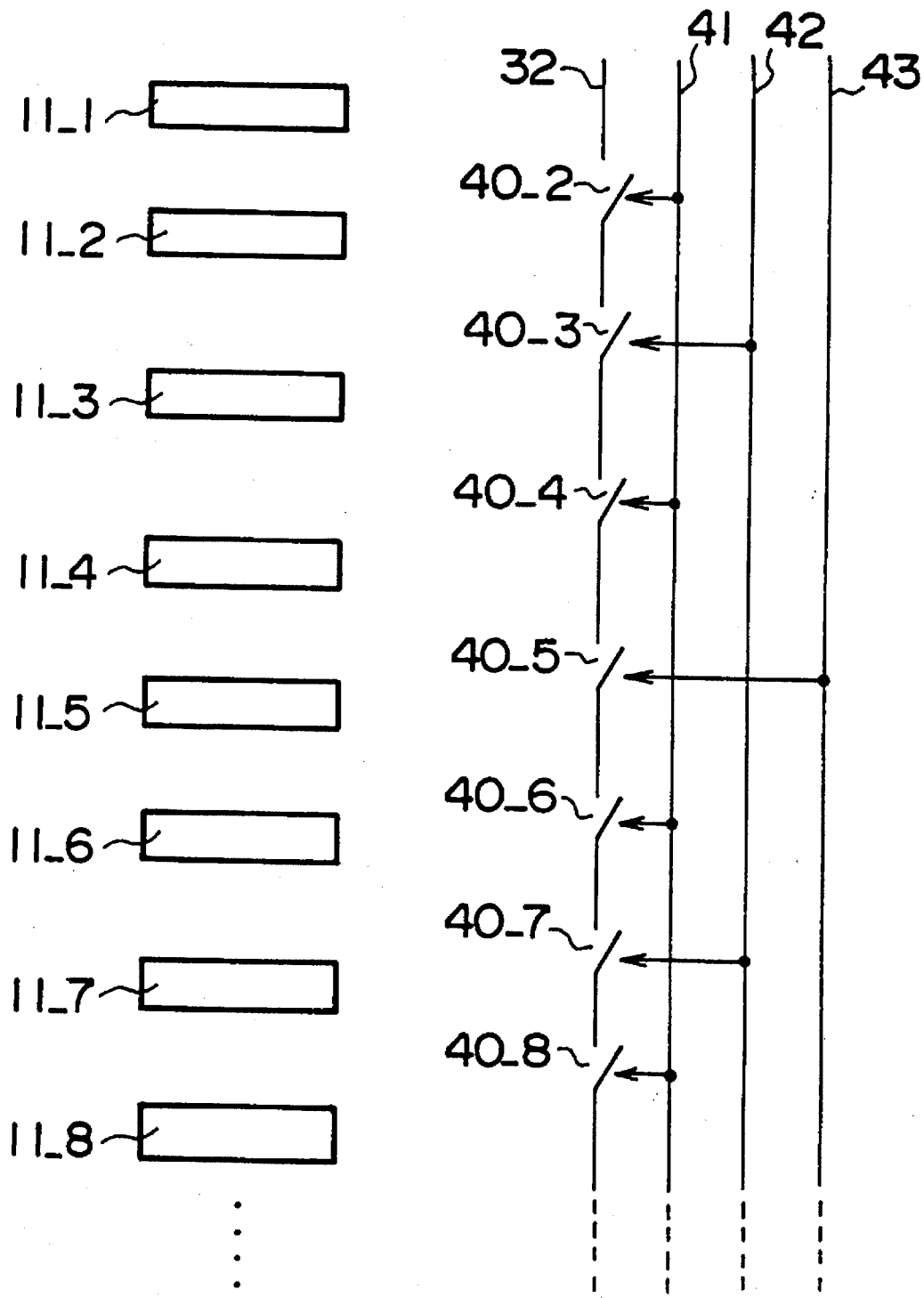
FIG. 5 is a typical illustration showing a scheme of implementing a variable length of data line.

FIG. 5 is a typical illustration showing a scheme of implementing a variable length of data line.

Data line 32 is extended over a plurality of word memories 11_1, 11_2, 11_3, .... On the data line 32 there are arranged in series switches 40_2, 40_3, 40_4, ..., which are associated with the word memories 11_2, 11_3, ..., respectively, except the uppermost stage of word memory 11_1. The switches 40_2, 40_3, 40_4, ... are disposed between the associated word memories 11_2, 11_3, 11_4, ... and the immediately upwards adjacent word memories 11_1, 11_2, 11_3, ..., respectively. Among the switches 40_2, 40_3, 40_4, ..., the switches 40_2, 40_4, 40_6, ... disposed every other switch turn on in accordance with the first switch control signal on the first control line 41; the switches 40_3, 40_7, ... disposed every fourth switch, the second switch control signal on the second control line 42;

and the switches 40_5, ... disposed every eighth switch among the remaining switches, the third switch control signal on the third control line 43.

In a case where the number of data constituting a data group is given with 2, supplying the first switch control signal to the first control line 41 causes the switches 40_2, 40_4, 40_6, ... disposed every other switch to turn on. Thus, there is formed the data line which is broken in every two word memories 11_1, 11_2; 11_3, 11_4; 11_5, 11_6; .... In a case where the number of data constituting a data group is given with 4, the first switch control signal is supplied to the first control line 41, and in addition the second switch control signal is supplied to the second controlline 42. As a result, there is formed the data line which is broken in every four word memories 11_1, 11_2, 11_3, 11_4; 11_5, 11_6, .... Likewise, in a case where the number of data constituting a data group is given with 8, the first switch control signal and the second switch control signal are supplied to the first control line 41 and the second control line 42, respectively, and in addition the third switch control signal is supplied to the third control line 43. As a result, there is formed the data line which is broken in every eight word memories 11_1, ..., 11_8; 11_9, ....

According to the above-described scheme, in a case where the number of data constituting a data group is given with 2N where N=integer, there occurs no idle in the word memory. However, in case of other than 2N, for example, 3, 5, 9, etc., there would occur idle word memories. The constitution, which permits a number of switches switches 40_2, 40_3, ... to optionally turn on and off, needs a lot of control lines, and also makes a control circuit for supplying the switch control signals to those control lines complicated. Consequently, the scheme shown in FIG. 5 is inadequate to control optionally a length of the data line.

Figure 6:
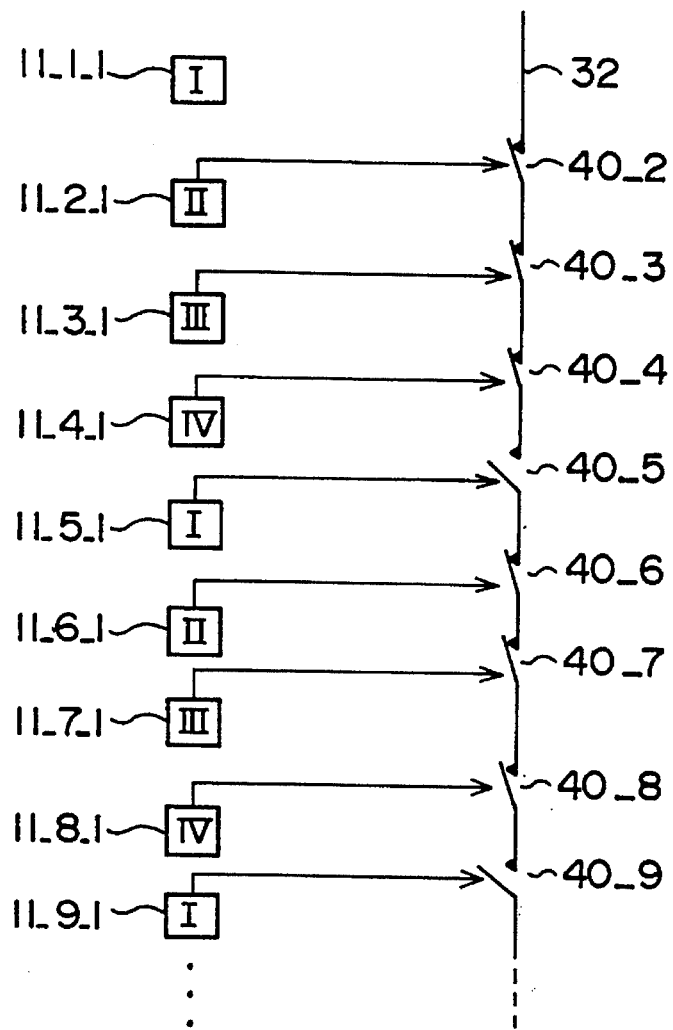
FIG. 6 is a typical illustration showing another scheme of implementing a variable length of data line.

FIG. 6 is a typical illustration showing another scheme of implementing a variable length of data line.

It is the same as the case in FIG. 5 that data line 32 is extended over a plurality of word memories, and on the data line 32 there are arranged in series switches 40_2, 40_3, 40_4, ..., which are associated with the word memories, respectively, except the uppermost stage of word memory.

The word memories are provided with attribute storage units 11_1_1, 11_2_1, 11_3_1, ..., respectively. In the attribute storage units 11_1_1, 11_2_1, 11_3_1, ..., there are stored attributes I, II, III and IV as shown in the figure, respectively. According to this example, it is so arranged that the switches are controlled in their turn-on or off depending on the attributes I or other than I, that is, II, III and IV which are stored in the attribute storage units 11_1_1, 11_2_1, 11_3_1, ..., in such a manner that in case of the attribute I the associated switch is kept off, and in case of the attributes II, III or IV the associated switch is turned on. Such an arrangement makes it possible to form the data line which is broken in every word memories automatically given with an adequate number, independently of the number of data constituting a data group, through disposing attribute I of data at the initial of each data group, even if there are mixed data groups each consisting of a different number of data.

Figure 7:
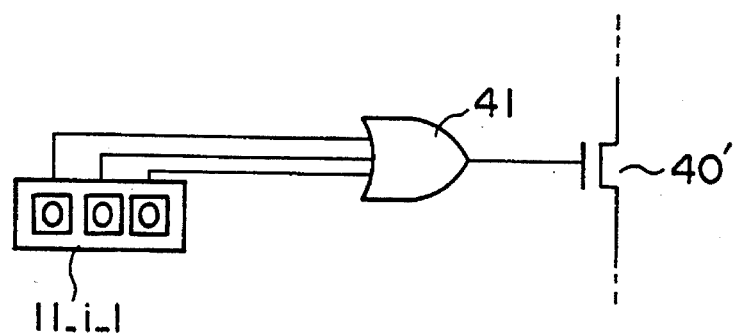
FIG. 7 is a circuit diagram of an attribute determination circuit for determining as to whether or not an attribute is of "I"

FIG. 7 is a circuit diagram of an attribute determination circuit for determining as to whether or not an attribute is of "0".

Here, it is assumed that "000" is assigned to the attribute I. When an attribute stored in an attribute storage unit 11_i_1 is the attribute I ("000"), an OR gate 41 produces a logic "0" signal. Thus, a switch 40' comprising a transistor turns off, so that the data line of the switch 40' is electrically broken in its both sides. When an attribute stored in the attribute storage unit 11_i_1 is other than the attribute I, the OR gate 41 produces a logic "1" signal. Thus, the switch 40' turns on, so that the data line of the switch 40' is electrically coupled between its both sides.

In this manner, in the associative memory shown in FIG. 4, it is also to adjust a length of each of the data lines 32_1, 32_2, ... in accordance with the number of data constituting a data group. It is acceptable to vary or adjust a length of the data line through controlling the switch with the use of control lines for exclusive use or providing additional attribute bits.

Next, there will be described an embodiment of the second associative memory of the present invention in which a technical idea of the present invention is applied to the associative memory shown in FIG. 4 and described above.

Figure 8:
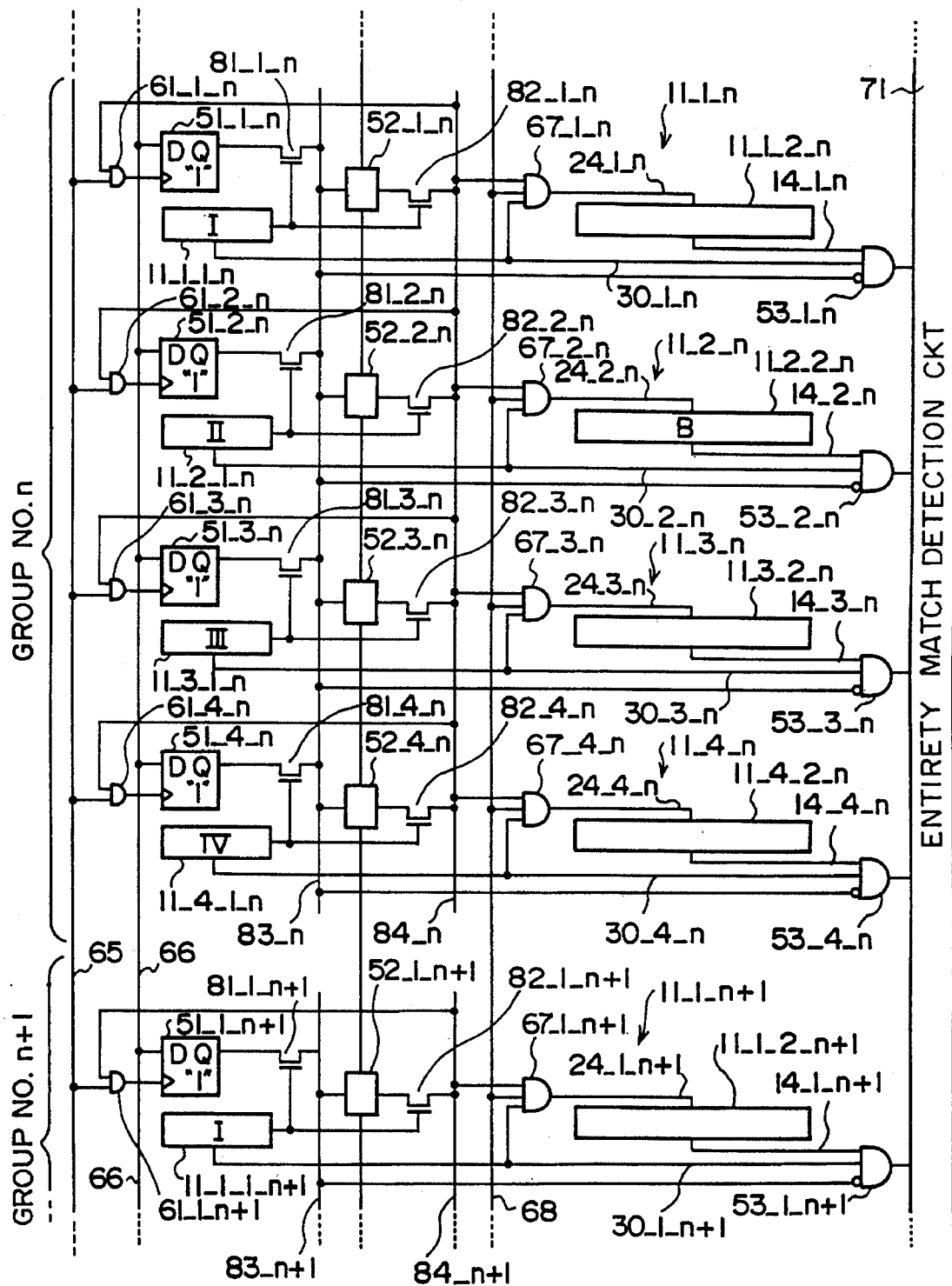
FIG. 8 is a circuit diagram of an aspect portion of the second associative memory according to an embodiment of the present invention.

FIG. 8 is a circuit diagram of an aspect portion of the second associative memory according to an embodiment of the present invention. In FIG. 8, the same parts are denoted by the same reference numbers as those of FIG. 1, and the redundant description will be omitted.

FIG. 8 shows a word memory group for storing data group related to the group No. n from among a plurality of data groups shown in FIG. 3, that is, the highest priority of one of the word memory groups which reside in the empty state.

The associative memory shown in FIG. 8 is, similar to that shown in FIG. 1, provided with flag registers ..., 51_1_n, 51_2_n, ..., 51_1_n+1, ..., associated with the word memories ..., 11_1_n, 11_2_n, ..., 11_1_n+1, ..., respectively. The flag registers ..., 51_1_n, 51_2_n, .., 51_1_n+1, ..., are controlled on a batch basis in units of word memory groups in such a manner as will be described later. In those flag registers, the top of the flag registers on each word memory group is effective.

The word memories ..., 11_1_n, 11_2_n, ..., 11_1_n+1, ..., consist of attribute storage units ..., 11_1_1_n, 11_2_1_n, ..., 11_1_1_n+1, ..., for storing attributes and data storage units ..., 11_1_2_n, 11_2_2_n, ..., 11_1_2_n+1, ..., for storing data, respectively. Incidentally, in FIG. 8, as a matter of convenience, the attribute storage units ..., 11_1_1_n, 11_2_1_n, ..., 11_1_1_n+1, ..., and data storage units ..., 11_1_2_n, 11_2_2_n, ..., 11_1_2_n+1, ..., are depicted at the mutually different places.

It is assumed that the respective word memories associated with the group numbers n and n+1 reside in the empty state, and thus flag registers 51_1_1_n, 51_2_1_n, ..., 51_1_1_n+1, ..., each store a logical value "1" of flag indicative of the empty state.

First transistors ..., 81_1_n, 81_2_n, ..., 81_1_n+1, ..., are controlled in their turn on/turn off through the associated control wires extending from the attribute storage units ..., 11_1_1_n, 11_2_1_n, ..., 11_1_1_n+1, ..., respectively. Those first transistors turn on only when the attribute storage units ..., 11_1_1_n, 11_2_1_n, ... 11_1_1_n+1, ..., store attribute I. Consequently, outputted to the firstvariable length data line 83_n associated with the group number n is a logical level "1" ("H" level) of signal indicative of the empty state, which is stored in the flag register 51_1_n. This signal is applied to four plural-selection separating circuits 52_1_n, 52_2_n, 52_3_n and 52_4_n in the word memory group associated with the group number n. Further, the signal appearing on the first variable length data line 83_n is applied through inversion in logic to four AND gates 53_1_n, 53_2_n, 53_3_n and 53_4_n in the word memory group associated with the group number n.

This is the similar as to the matter of the word memory group associated with the group No. n+1. A logical level "1" of signal, which is stored in the flag register 51_1_n+1, is applied via the first variable length data line 83_n+1 to four plural-selection separation circuits 52_1_n+1, . . . , and upon inversion in logic to four AND gates 53_1_n+1, . . .

As shown in FIG. 3, when an effective data group has been stored in the word memory group associated with the group No. 1, 2, . . . , n-1, a logical value "1" ( "H" level) of signal indicative of the highest priority is outputted from the uppermost stage of plural-selection separating circuit 52_1_n among four plural-selection separating circuits 52_1_n, 52_2_n, 52_3_n and 52_4_n. Outputs of the plural-selection separating circuits . . . , 52_1_n, 52_2_n, . . . , 52_1_n+1, . . . , are connected to the second transistors . . . , 82_1_n, 82_2_n, . . . , 82_1_n+1, . . . , respectively. Those second transistors turn on, similar to the first transistors . . . , 81_1_n, 81_2_n, . . . , 81_1_n+1, . . . , only when the attribute storage units . . . , 11_1_1_n, 11_2_1_n, . . . 11_1_1_n+1, . . . , store attribute I. A logical value "1" of signal outputted from the plural-selection separating circuit 52_1_n is passed through the second transistors 82_1_n to the second variable length data line 84_n. Here, the highest priority of word memory group is assigned to the group number n. Consequently, the output of the plural-selection separating circuit 52_1_n+1 involved in the word memory group associated with the group number n+1 is of a logical value "0", so that the logical value "0" of signal, which is the output of the plural-selection separating circuit 52_1_n+1, is supplied to the second variable length data line 84_n+1 associated with the group number n+1.

The attribute storage units . . . , 11_1_1_n, 11_2_1_n, . . . , 11_1_1_n+1, . . . , are coupled via attribute match lines . . . , 30_1_n, 30_2_n, . . . , 30_1_n+1, . . . , to input terminals of the AND gates . . . , 53_1_n, 53_2_n, . . . , 53_1_n+1, . . . , respectively. The attribute match lines . . . , 30_1_n, 30_2_n, . . . , 30_1_n+1, . . . , are enabled, upon receipt of a match of the attribute in the retrieval, with a logical value "1" ("H" level) of signal. The data storage units . . . , 11_1_2_n, 11_2_2_n, . . . , 11_2_1_n+1, . . . , are coupled via data match lines . . . , 14_1_n, 14_2_n, . . . , 14_1_n+1, . . . , to input terminals of the AND gates . . . , 53_1_n, 53_2_n, . . . , 53_1_n+1, . . . , respectively. The data match lines . . . , 14_1_n, 14_2_n, . . . , 14_1_n+1, . . . , are enabled, upon receipt of a match of the data in the retrieval, with a logical value "1" ("H" level) of signal, in a similar fashion to that of the attribute match lines . . . , 30_1_n, 30_2_n, . . . , 30_1_n+1, . . . ,.

Assuming that when data retrieval is conducted through inputting attribute II and data "B", data "B" has been stored in the data storage unit 11_2_2_n of the word memory 11_2_n wherein the attribute storage unit 11_2_1_n stores attribute II, accidentally. Then, upon receipt of a match of the attribute, the attribute match line 30_2_n is enabled with a "H" level. And upon receipt of a match of the data, the data match line 14_2_n is also enabled with a "H" level. However, since the first variable length data line 83_n resides in a "H" level indicative of the empty state, a "H" level of signal indicative of the match is not derived from the AND gate 53_2_n. In other words, the word memories residing in the empty state do not attend to the retrieval.

While the retrieval is conducted, regardless of whether or not the match is detected in any word memory groups, a logical value "1" of signal is outputted from the additional writing control circuit 72 (see FIG. 1) to the word line activating timing signal line 68. As a result, all the inputs of the AND gate 67_2_n associated with the word memory 11_2_n, which is the second one from the top in FIG. 8, become "1", and a logical value "1" of signal appears on the word line 24_2_n extending to the output end of the AND gate 67_2_n. Thus, the retrieval data is written into the word memory 11_2_n. The timing of writing of the retrieval data is the same as the retrieval, and thus it is independently of whether or not the match occurs in the retrieval.

After the above-mentioned retrieval and writing of the retrieval data are carried out a predetermined number of times, the additional writing control circuit 72 (see FIG. 1) receives information as to whether or not a desired data group is finally detected. In the additional writing control circuit 72, when a desired data group is detected in any word memory group, there is nothing to do thereafter. Specifically, while the retrieval data is written into the word memory group associated with the group number n shown in FIG. 8, whenever the retrieval is conducted, the flag registers 51_1_n, 51_2_n, 51_3_n and 51_4_n associated word memory concerned stores still the empty flag "1". Consequently, the word memory group associated with group number n is kept placed in the empty state such that it does not contribute to the retrieval.

On the other hand, when the entirety match detection circuit 71 does not detect any desired data group throughout the word memory groups, the additional writing control circuit 72 operates as follows.

While a logical value "0" of signal is applied to an empty flag data line 66 connected to the flag registers . . . , 51_1_1_n, 51_2_1_n, . . . , 51_1_1_n+1, . . . , a clock pulse "1" is applied to an empty flag clock signal line 65. Since a logical value "1" of signal is applied to the second variable length data line 84_n extending to the word memory group associated with the group number n shown in the figure, the clock pulse "1" applied to the empty flag clock signal line 65 is entered through four AND gates 61_1_n, 61_2_n, 61_3_n and 61_4_n to four flag registers 51_1_n, 51_2_n, 51_3_n and 51_4_n. Thus, the flag registers 51_1_n, 51_2_n, 51_3_n and 51_4_n store a logical value "0" indicating that effective data group have been recorded therein.

As the flag registers 51_1_n, 51_2_n, 51_3_n and 51_4_n associated with a group number n store a logical value "0", the plural-selection separating circuits . . . , 52_1_n, 52_2_n, . . . , 52_1_n+1, . . . , may detect the highest priority of one (in this case, word memory group associated with group number n+1) from among the word memory groups associated with the flag registers storing the empty flag "1", except for the word memory group associated with group number n.

According to the embodiment of the invention shown in FIG. 8, upon receipt of information indicating the fact that none of the word memory groups stores a desired data group, the additional writing control circuit 72 automatically writes a logical value "0" of flag for releasing the empty state into the flag register associated with the highest priority of word memory group (in this case, word memory group associated with group number n). The present invention is not restricted to this embodiment. It is acceptable to release the empty state of the highest priority of word memory group in such a manner that the additional writing control circuit 72 is arranged to permit a predetermined control signal to be entered from the exterior, and upon receipt of the control signal from the exterior the empty state is released.

The present invention is not limited to the particular embodiments described above. Various changes and modifications may be made within the spirit and scope of the invention.

I claim:

1. An associative memory comprising:

at least one word memory for storing data;

at least one match detection circuit associated with said word memory and detecting one of a match and a mismatch between at least a partial bit pattern of an entered retrieval data and a bit pattern corresponding to said at least partial bit pattern of the retrieval data and which is stored in said word memory; and a data addition writing circuit for detecting a failure state, wherein none of said match detection circuits outputs a match signal indicative of a match between said at least partial bit pattern of the entered retrieval data and corresponding bit pattern stored in the at least one word memory and for overwriting the at least partial bit pattern of the entered retrieval data into an empty one of the at least one word memory upon detecting the failure state.

2. An associative memory according to claim 1, wherein said data addition writing circuit comprises:

at least one flag register, each flag register associated with one of said at least one word memory and storing a flag indicative of whether the associated word memory is residing in said empty state;

a retrieval data writing circuit for selecting one word memory from among word memories residing in said empty state to store said at least partial bit pattern of the entered retrieval data in the selected word memory; and a flag alteration circuit for altering said flag register associated with said selected word memory to store a flag indicating the selected word memory is not residing in the empty state when the data addition writing circuit detects the failure state.

3. An associative memory comprising:

a plurality of word memory groups, each word memory group comprising a plurality of word memories and storing a single data group, the single data group comprising a plurality of storage data portions, each word memory storing at least one of the plurality of storage data portions;

a plurality of data match detection circuits, each data match detection circuit detecting one of a match and a mismatch between at least one data portion of an entered retrieval data and a corresponding at least one storage data portion stored in a corresponding one of the word memories of the plurality of word memory groups; and a data writing circuit for writing the corresponding at least one data portion in a corresponding at least one of the plurality of word memories of an empty one of the plurality of word memory groups, in response to detecting a failure state wherein none of the plurality of data match detection circuits outputs a match signal indicative of a match between said at least one data portion and the corresponding ones of the data storage portions stored in corresponding ones of the word memories of the plurality of word memory groups.

4. An associative memory according to claim 3, further comprising:

a plurality of flag registers, each one of the plurality of flag registers corresponding to an associated one of said plurality of word memory groups, and storing a flag indicative of whether the associated word memory group is residing in one of a storage state and an empty state; and a flag alteration circuit for altering said flag register associated with said empty one of the plurality of word memory groups to store a flag indicative of said storage state, when the data addition writing circuit detects the failure state for at least one data portion of the entered retrieval data.

5. An associative memory according to claim 3, further comprising:

a plurality of flag registers, each one of the plurality of flag registers corresponding to an associated one of said plurality of word memory groups, and storing a flag indicative of whether the associated word memory group is in one of a storage state and an empty state; and a flag alteration circuit responsive to a predetermined instruction signal for altering each said flag register associated with said empty one of the plurality of word memory groups to store a flag indicative of said storage state.

* * * * *